United States Patent [19]
Dhong et al.

[11] Patent Number: 5,292,678
[45] Date of Patent: Mar. 8, 1994

[54] FORMING A BIT LINE CONFIGURATION FOR SEMICONDUCTOR MEMORY

[75] Inventors: Sang H. Dhong, Mahopac; Wei Hwang, Armonk, both of N.Y.

[73] Assignee: International Business Machines Corporation, Armonk, N.Y.

[21] Appl. No.: 882,735

[22] Filed: May 14, 1992

Related U.S. Application Data

[62] Division of Ser. No. 787,196, Nov. 4, 1991, Pat. No. 5,170,243.

[51] Int. Cl.$^5$ .......................................... H01L 21/265
[52] U.S. Cl. ........................................ 437/50; 437/52; 437/195; 437/49
[58] Field of Search .................... 437/43–60, 437/192–200, 228; 257/207–316, 758; 365/185

[56] References Cited

U.S. PATENT DOCUMENTS

| | | | |
|---|---|---|---|
| 4,576,900 | 3/1986 | Chiang | 257/758 |
| 4,833,518 | 5/1989 | Matsuda et al. | 357/45 |
| 4,937,649 | 6/1990 | Shiba et al. | 257/207 |
| 5,084,414 | 1/1992 | Manley et al. | 437/192 |
| 5,172,202 | 12/1992 | Kazuo | 257/306 |

FOREIGN PATENT DOCUMENTS

| | | |
|---|---|---|
| 0239187 | 1/1987 | European Pat. Off. . |
| 0401686 | 5/1990 | European Pat. Off. . |
| 0452648 | 1/1991 | European Pat. Off. . |
| 3910033 | 5/1989 | Fed. Rep. of Germany . |

OTHER PUBLICATIONS

Patent Abstracts of Japan, vol. 12, No. 351 (E-660) (3198) Sep. 20, 1988 and JP 63-108764 (NEC Corp).
IBM Technical Disclosure Bulletin, "Folded Bitline Configuration", vol. 30, No. 3, Aug. 1987, pp. 1314–1315.

*Primary Examiner*—Olik Chaudhuri
*Assistant Examiner*—H. Jey Tsai
*Attorney, Agent, or Firm*—John J. Goodwin; David Aker; Jeffrey L. Brandt

[57] ABSTRACT

A new interdigitated folded bit line (IFBL) architecture for a future generation high density semiconductor memory design is disclosed. In the architecture, the basic cross-point memory cells are organized orthogonally in rows and columns to form an array matrix. The bit lines run in a row direction while the word lines run in a column direction. Transfer transistors are designed to be shared with the same drain junction and the same bit line contact in order to save area. A choice of at least two described embodiments are provided. In one embodiment, referred to as the offset bit line structure, the bit lines are constructed by using two layers of interconnection lines to connect the interdigitated cells associated to it. By connecting the bit line contacts and with two different interconnecting layers and in an alternating row order, the true and complement bit lines and will run parallel to both sides of the memory array. In another embodiment, referred to as the side wall bit line structure, the bit lines are constructed by using the conductive side wall spacer rails to connect the interdigitated cells associated to it. By connecting the side wall bit line contacts with two sided-side wall spacer rails in an alternating row order, the true and complement bit lines will run parallel to both sides of the memory array.

1 Claim, 9 Drawing Sheets

FIG. 1
(PRIOR ART)
CONVENTIONAL OPEN BIT LINE 11

FIG. 2
(PRIOR ART)
CONVENTIONAL FOLDED BIT LINE

FORMING A BIT LINE CONFIGURATION FOR SEMICONDUCTOR MEMORY

This is a division of application Ser. No. 07/787,196, filed Nov. 4, 1991, now U.S. Pat. No. 5,170,243.

BACKGROUND OF THE INVENTION

1. Field of the Invention

The present invention relates to bit line arrays for dynamic random access semiconductor memories, and more particularly to an interdigitated folded bit line architecture for memory cells.

2. Description of the Prior Art

U.S. Pat. No. 4,922,453, issued May 1, 1990 to Hidaka entitled *BIT LINE STRUCTURE OF DYNAMIC TYPE SEMICONDUCTOR MEMORY DEVICE*, discloses a semiconductor memory device of a folded bit line structure that comprises a plurality of bit line pairs in which each bit line pair is divided into a plurality of blocks along a longitudinal direction, and each divided bit line pair is formed by an interconnection layer at a level above a substrate different from the level of an adjacent divided bit line pair in the same block and different from the level of the same bit line pair in an adjacent block.

U.S. Pat. No. 4,807,017, issued Feb. 21, 1989 to Ema et al entitled *SEMICONDUCTOR MEMORY DEVICE WITH WIRINGS HAVING ENSURED CROSS SECTIONS*, discloses a memory cell matrix region of a semiconductor memory device such as a dynamic RAM or a static RAM wherein wirings of the same material are distributed between different layers in such a manner that the upper wirings overlap the lower wirings. Accordingly, the width of the wirings can be increased for a semiconductor memory device having a high concentration and high integration.

U.S. Pat. No. 4,977,436, issued Oct. 9, 1990 to Tsuchiya et al entitled *HIGH DENSITY RAM*, disclosed a high density DRAM having a plurality of cells each including a storage capacitor and a single control FET formed together in a trench to substantially reduce planar area of the cell. The FET drain is formed in the upper portion of a pedestal and is accessible externally through a metal line, which reduces line resistance and capacitance. Field oxide is included to isolate capacitors and reduce leakage and breakdown.

U.S. Pat. No. 4,962,476, issued Oct. 9, 1990 to Kawada entitled *SEMICONDUCTOR MEMORY DEVICE HAVING BIT LINES LESS LIABLE TO HAVE INFLUENCES OF THE ADJACENT BIT LINES*, discloses a semiconductor memory device that has a plurality of memory cells of the one-transistor and one-capacitor type, and a plurality of bit lines coupled to columns of the memory cells, respectively, and disposed in an insulating film over the memory cells, and a common upper electrode is shared by the storage capacitors of the memory cells and has shield portions interposed between the bit lines, so that the adjacent bit lines are less liable to be capacitively coupled by virtue of the shield portions, thereby allowing data bit signals to propagate without any undesirable influence of the adjacent bit lines.

U.S. Pat. No. 4,941,031, issued Jul. 10, 1990 to Kumagai et al entitled *DYNAMIC MEMORY DEVICE WITH IMPROVED WIRING LAYER LAYOUT*, discloses a structure wherein a signal line runs in parallel with first to fourth bit lines on a memory cell array of a dynamic memory device. The signal line runs between and along the first and third bit lines, turns at a predetermined position, turns again and runs between and along the second and fourth bit lines. The predetermined turning position is a position corresponding to the half of the bit line length. The result is that the stray capacitances between the signal line and these bit lines are equal.

U.S. Pat. No. 4,937,649, issued Jun. 26, 1990 to Shiba et al entitled *SEMICONDUCTOR INTEGRATED CIRCUIT HAVING A CAPACITOR FOR STABILIZING A VOLTAGE AT A POWER SUPPLYING WIRING*, describes a semiconductor integrated circuit that includes a semiconductor substrate, a plurality of logic gates formed in the semiconductor substrate, power source wiring and ground wiring formed on the semiconductor substrate to supply power source voltage to the logic gates and a capacitor formed on the semiconductor substrate and distributively connected between the power source wiring and the ground wirings.

U.S. Pat. No. 4,873,560, issued Oct. 10, 1989 to Sunami et al entitled *DYNAMIC RANDOM ACCESS MEMORY HAVING BURIED WORD LINES*, discloses a structure that relates to a very large scale dynamic random access memory, and discloses a memory cell having a reduced step on the device surface portion and having a reduced step on the device surface portion and being hardly affected by incident radioactive rays. In a semiconductor memory consisting of a deep hole bored in a semiconductor substrate, a capacitor formed on the side-wall portion at the lower half of the deep hole and a switching transistor formed immediately above the capacitor, at least the half of a word line constituting the gate of the switching transistor is buried in an elongated recess formed at the surface portion of the semiconductor substrate. U.S. Pat. No. 4,833,518, issued May 23, 1989 to Matsuda et al entitled *SEMICONDUCTOR MEMORY DEVICE HAVING IMPROVED INTERCONNECTION STRUCTURE OF MEMORY CELL ARRAY*, describes a structure wherein a memory cell array is divided into two groups, one bit line of a pair of bit lines is connected to corresponding memory cells in the first group of the memory cell array, and the other bit line thereof is connected to corresponding memory cells in the second group of the memory cell array.

U.S. Pat. No. 4,710,789, issued Dec. 1, 1987 to Furutani et al entitled *SEMICONDUCTOR MEMORY DEVICE*, discloses a semiconductor memory device wherein memory cells of a first column each comprising an N-channel FET are connected to a first bit line and memory cells of a second column each comprising a P-channel FET are connected to a second bit line. The first bit line and the second bit line are connected to complementary terminals of a sense amplifier to form a folded bit line pair. A word line is connected to the gate of the N-channel FET of one of the memory cells of the first column and to the gate of the P-channel FET of one of the memory cells of the second column. The word line is selectively provided with a first voltage to make conductive the N-channel FET connected thereto and to make nonconductive the P-channel FET connected thereto, or a second voltage to make conductive the P-channel FET connected thereto and to make nonconductive the N-channel FET connected thereto, or a third voltage to make nonconductive both the N-channel FET and the P-channel FET connected thereto.

SUMMARY OF THE INVENTION

An object of the present invention is to provide a semiconductor memory structure wherein noise immunity and high packing density are achieved.

Another object of the present invention is to provide a semiconductor memory structure wherein a first bit line and its complement are formed in a first wiring layer, and a second bit line and its complement are located in a second wiring layer located above the first wiring layer.

A further object of the present invention is to provide a semiconductor memory structure wherein bit lines are stacked and horizontally offset to reduce parasitic capacitance.

DESCRIPTION OF THE PREFERRED EMBODIMENT

Figure 1:
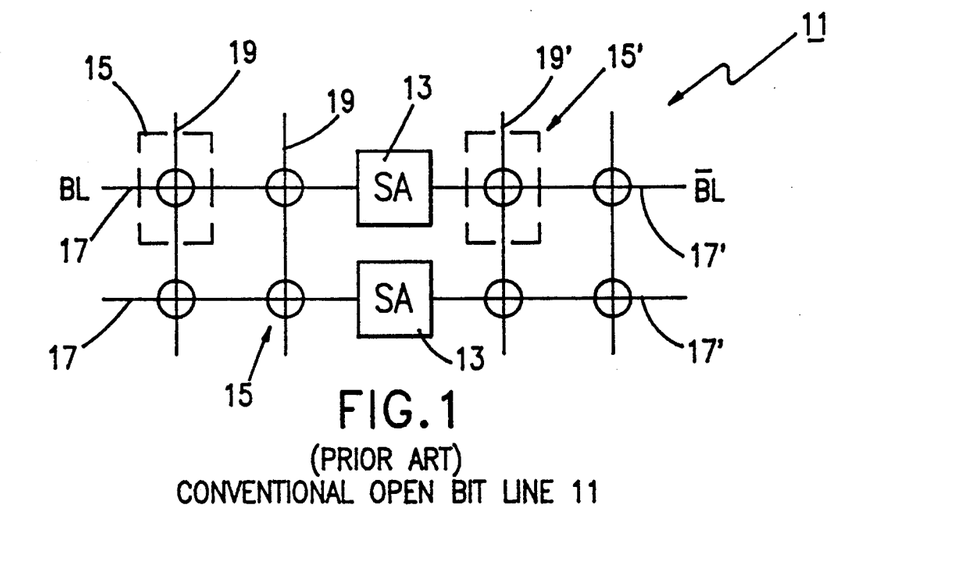
FIG. 1 is a schematic illustration of a folded bit line cell layout according to the prior art.
Figure 2:
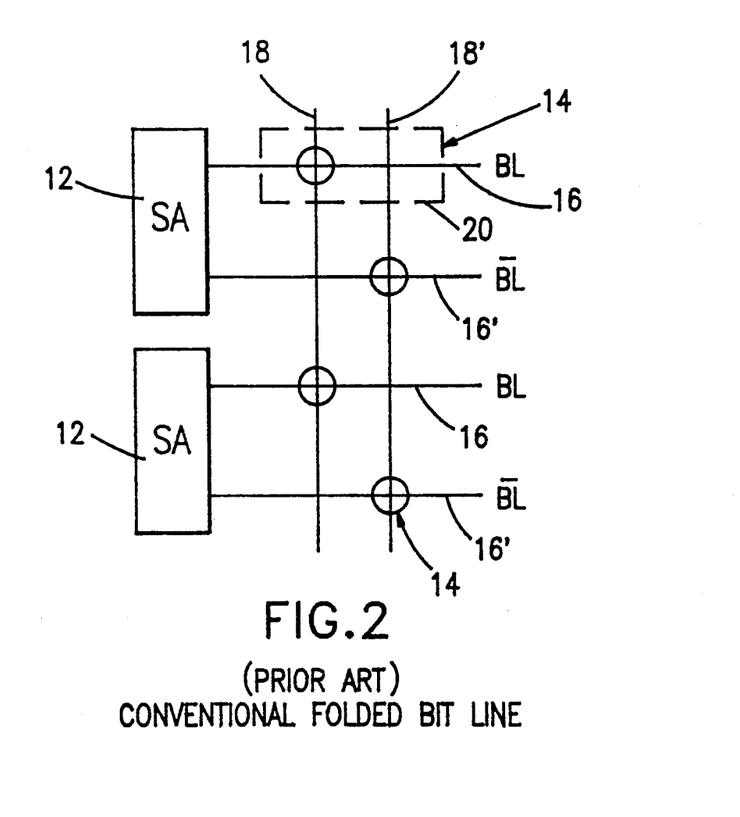
FIG. 2 is a schematic illustration of an open bit line cell layout according to the prior art.

The conventional open bit line (OBL) architecture 11 includes sense amplifier 13 and (true) memory cells 15 formed at the intersection of the bit line 17 and word line 19 on one side of the sense amplifiers 13, and (complement) memory cells 15' formed at the intersection of bit line 17' and word line 19' on the other side of sense amplifiers 13. The open bit line architecture allows for high packing density of memory cells and permits a cross-point layout of cell structures that optimize the available cell matrix space. Several deficiencies in the OBL architecture have been recognized. A small sense amplifier pitch creates sense amplifiers and decoder layout difficulties. Moreover, the bit lines and their complements are located in different substrate wells which contribute to different bit line swing and substrate bouncing noises. The presence of these non-common mode noises lead to low noise immunity. The folded bit line architecture (FBL) as shown in FIG. 2 was adopted to improve the noise immunity of the memory cell. At the same time, it provides larger layout pitches for the sense amplifiers and decoders. As shown in FIG. 2, the conventional folded bit line architecture includes sense amplifiers 12 each having a corresponding pair of bit line 16 and 16' extending from one side of the amplifiers 12. The memory cell 20 is formed at intersections of the bit line 16 and two word lines 18 and 18'. The folded bit line architecture provides high noise immunity resulting from better noise rejection and relaxed sense amplifier pitch allowing easier implementation of sense amplifiers and decoders. However, a drawback of the folded bit line architecture is that it requires a lower packing density of memory cells than the open bit line architecture as shown in FIG. 1. The folded bit line architecture cannot utilize a cross-point layout cell structure and this results in inefficient use of the cell matrix space.

Disclosed herein is a new interdigitated folded bit line (IFBL) architecture for a future generation high density semiconductor memory design. This structure is superior to the previously reported high density conventional open bit line cell layout design as shown in FIG. 1 or folded bit line cell layout design as shown in FIG. 2, because it will achieve the advantages of ultra-high packing density and noise immunity. It will also overcome the disadvantages of open bit line structures for sensing and decoding.

Figure 3:
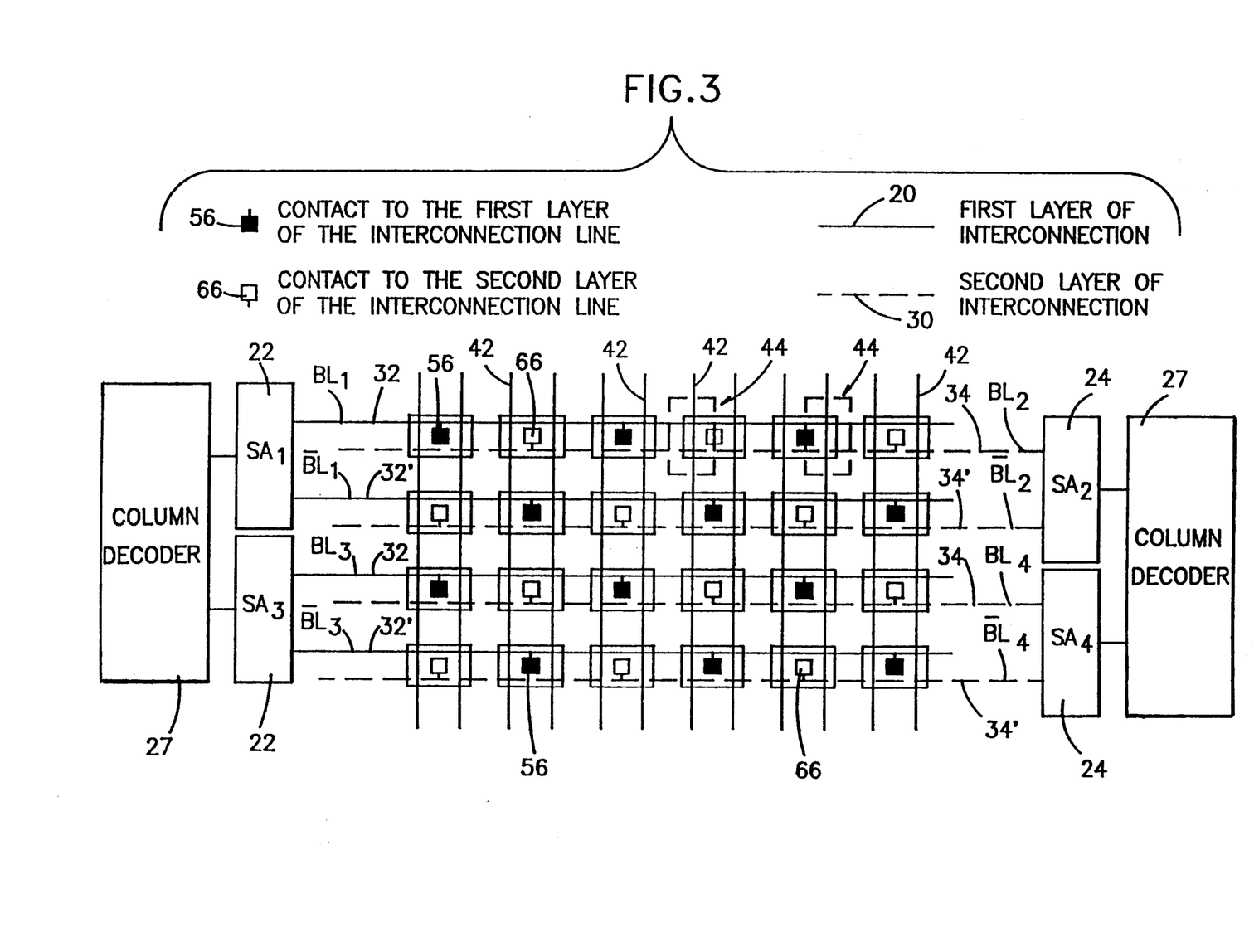
FIG. 3 is a schematic illustration of an embodiment of an interdigitated folded bit line structure according to the principles of the present invention.

The new IFBL architecture for the cross-point memory cell design together with its schematic layout is shown in FIG. 3. The basic cross-point cells are organized orthogonally in rows and columns to form an array matrix. The bit lines 32 run in a row direction while the word lines 42 run in a column direction. Also, the two transfer transistors are designed to be shared with the same drain junction and the same bit line contact in order to save area. The bit lines are constructed by using two layers of interconnection lines to connect the interdigitated cells associated to it. By connecting the bit line contacts 56 and 66 with two different interconnecting layers 20 and 30 in an alternating row order, the true and complement bit lines 32 and 32' will run parallel to both sides of the memory array. Thus, the sense amplifiers 22 are easily designed to be located at both sides of the memory array. The column decoders 27 are designed to be located adjacent to the sense amplifiers 22 and to receive the true and complement bit line signals. For example, in FIG. 3, BL1 32 and BL1 32' (true and complement bit lines respectively) are connected to the first layer of the interconnection line 20 which is connected to the sense amplifier SA1 22. BL2 34 and BL2 34' are connected to the second layer of the interconnection line 30 which is connected to the sense amplifier SA2 24. In SA1 22 and SA2 24, the BL1 32 and BL2 34 pairs have folded bit line structures. This new bit line cell layout 44 solves the sense amplifier pitch and column decoder design problems which are present in the conventional open bit line structure. Furthermore, both BL and $\overline{BL}$ are now located on the same input side of the sense amplifier. This will reduce the bit line swing noise problem.

Figure 4:
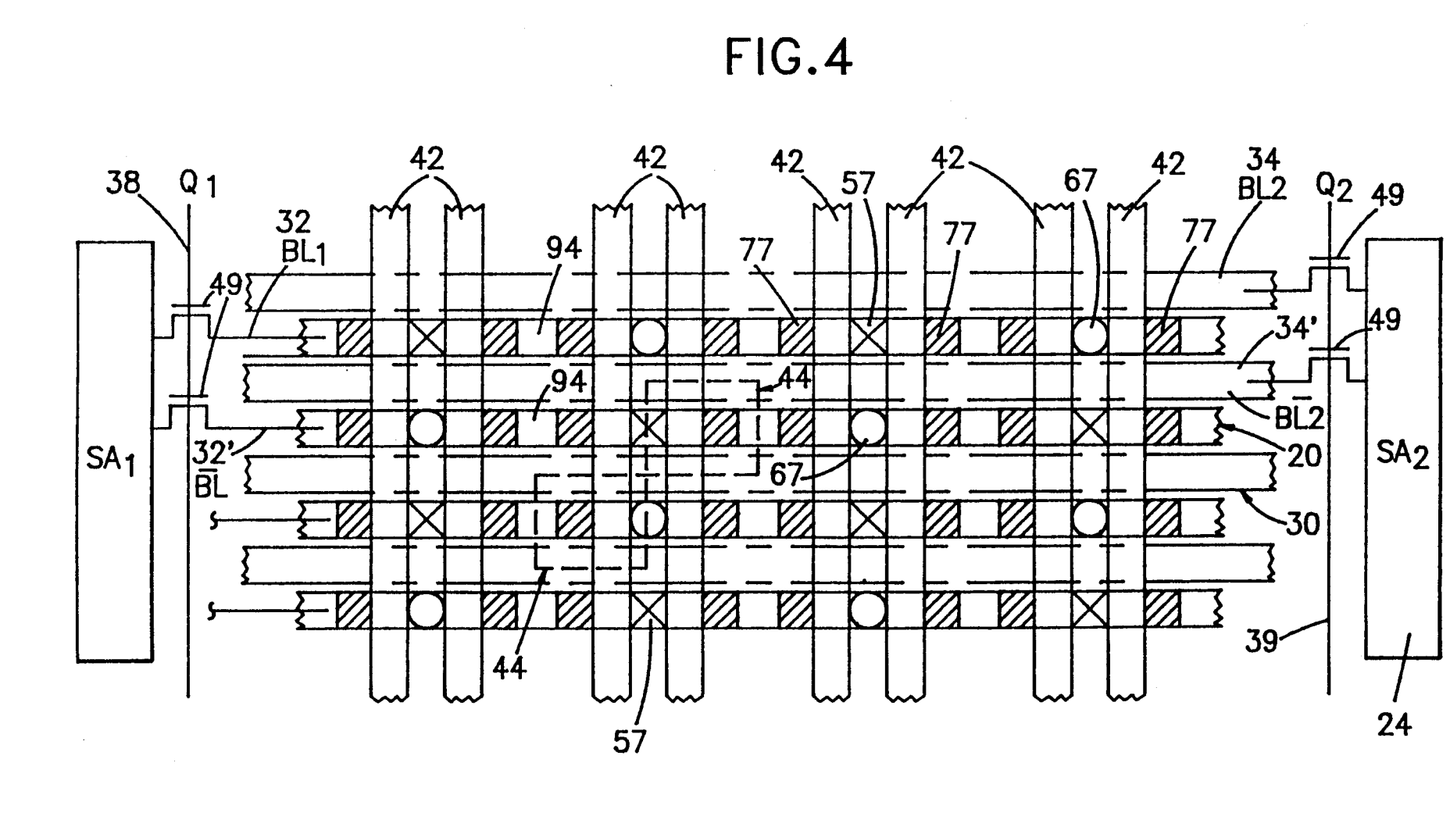
FIG. 4 is a schematic illustration of an off-set bit line contact configuration that can be used in the structure of FIG. 3.

FIG. 3 is clarified further with two practical design examples. The first example uses the off-set bit line contact approach to implement the IFBL array as shown in FIG. 4. The layout design has been carefully considered in the bit line direction. The basic cells have been arranged into an array with alternating and extended positions of the off-set bit line contacts in the odd/even rows, as shown in FIG. 4. The first set of the true and complement bit lines 32 and 32' are formed in the first interconnection layer 20 in parallel direction to both sides of the memory array. The second set of the true and complement bit lines 34 and 34' are connected to the off-set bit line contacts 67 to the second interconnection layer 30 in parallel direction just right on the top of STI 94 isolation position. The coupling capacitance between two off-set bit line pairs can be reduced significantly. It should be noted that each sense amplifier 22 or 24 is connected by four bit lines instead of two bit lines as shown in FIG. 4. Also, the decoupling devices 49 are added between the sense amplifier and bit line section to control the sensing timing. This design has the advantage to further improve the sense amplifier pitch and decoder design problems. The off-set bit line contact structure together with its process flows is shown in FIG. 5 and FIGS. 6 through 10.

Figure 5:
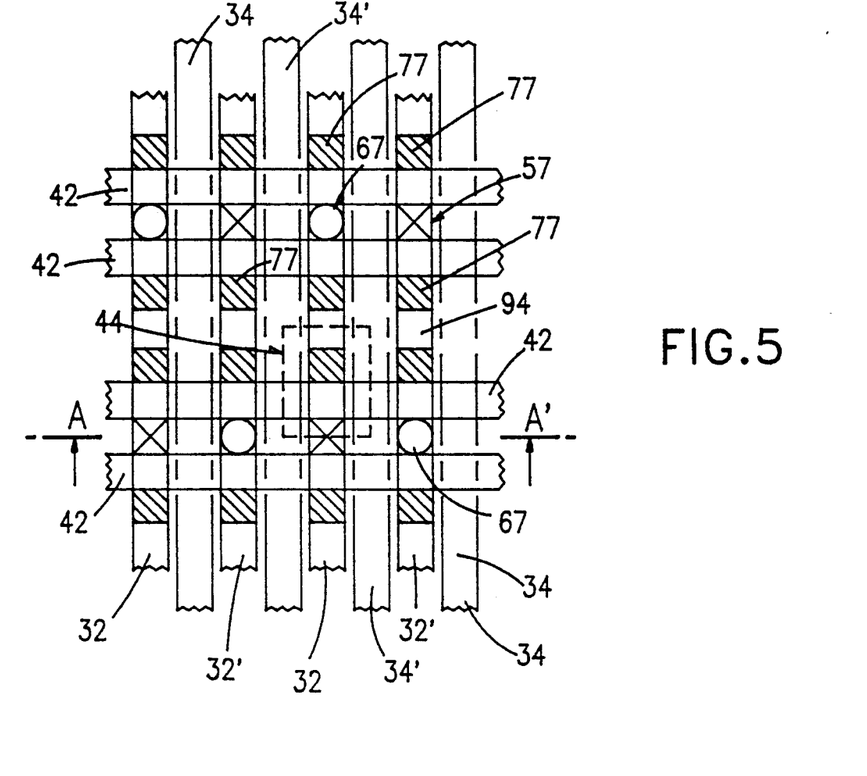
FIG. 5 is a more detailed schematic illustration of the off-set bit line contact structure according to the principle of the present invention.
Figure 6:
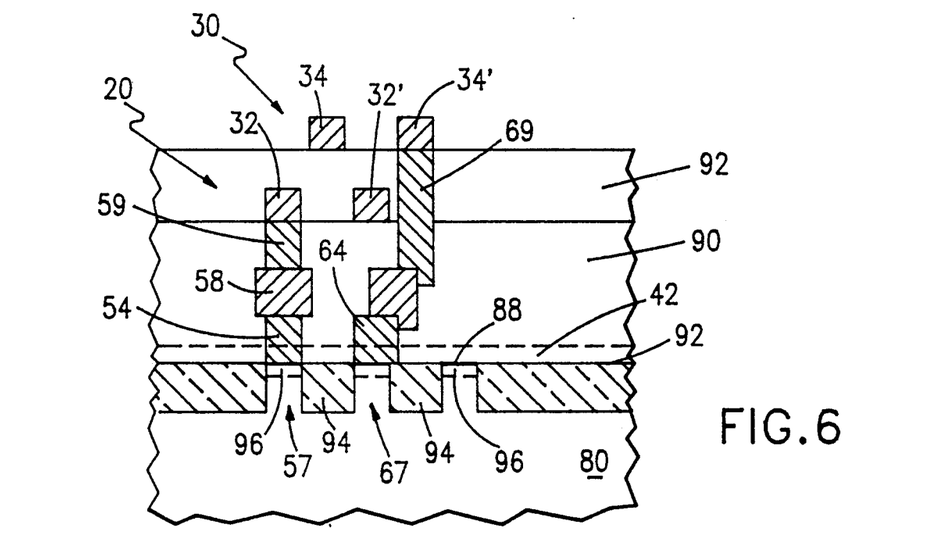
FIGS. 6, 7, 8, 9 and 10 are schematic illustrations showing the structure of the off-set bit line contact structure of the present invention during steps in the fabrication process thereof.

FIGS. 5 and 6 are a top view and a cross section view of a portion of a sub-array of FIG. 4, respectively. A memory cell 44 is placed at each intersection of a word line 42 and a bit line. Two memory cells are designed to be shared with same drain junction 96 and same bit line contacts 57 or same off-set bit line contacts 67. Referring to FIG. 6, the bit line is in contact with studs 54 and 64 via silicide 88 at the silicon surface 92 to the drain junction 94, that resides in substrate 80. Bordering either side of drain junction 96 are shallow trench isolation (STI) areas 94. BL1 pair 32 and 32' are formed in the first metal layer 20 and are connected to each of memory cells by contacts 57. BL2 pair 34 and 34' are formed in the second metal layer 30 and are connected to each of memory cells by the off-set bit line contacts 67.

Turning now to FIGS. 7-10, the method of fabrication employed to achieve the off-set bit line contact structure to implement the IFBL array, as shown in FIGS. 5 and 6, will be described.

Figure 7:
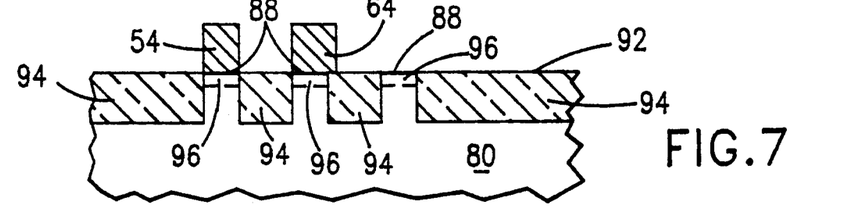

In FIG. 7, a cross section illustration of the structure is shown with transfer transistors and storage capacitors placed therein using known DRAM technology. Next, the polysilicon bit line studs 54 and 64 are formed which provide contact, via silicide 88 at the silicon surface 92, to the drain junction 96 that resides in substrate 80. Bordering either side of drain junction 96 are shallow trench isolation (STI) areas 94.

Figure 8:
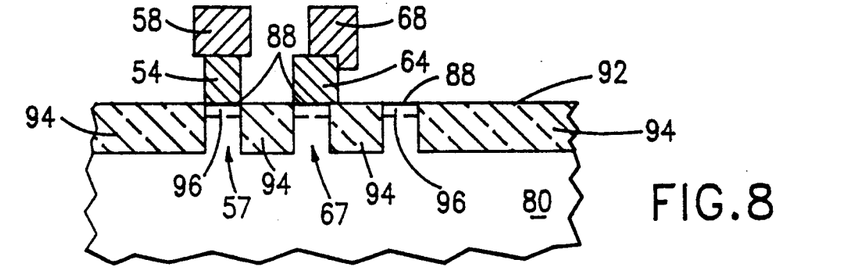
Figure 9:
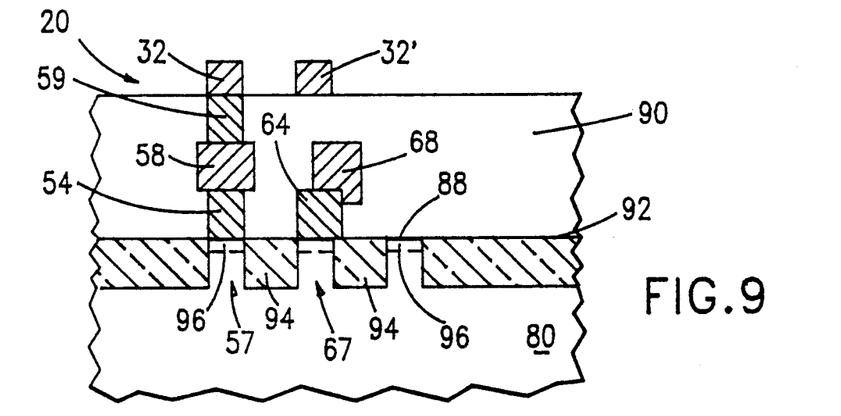
Figure 10:
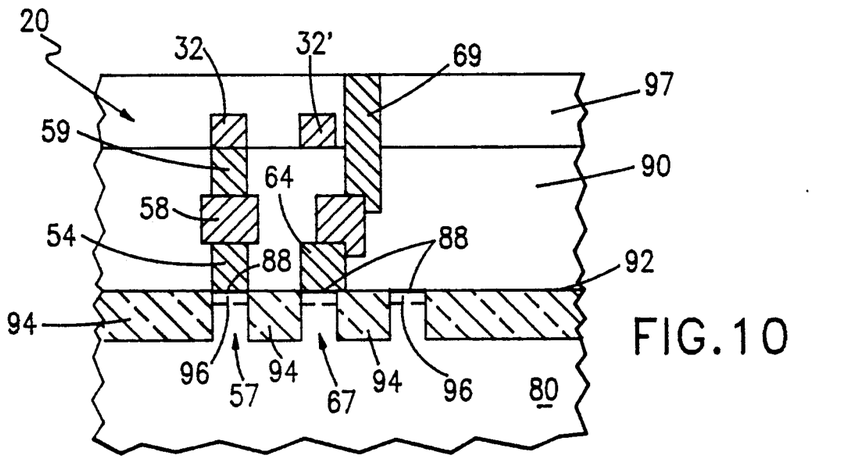

Subsequently, as shown in FIG. 8, the first contact tungsten (W) via 58 and offset W via 68 are formed and planarized. Referring to FIG. 9, an insulating PSG material 90 is deposited and planarized. Then, a bit line connection via-hole 59 is developed. Next, the first metal layer 20 (using either W or Al) is deposited. The first bit line pairs 32 and 32' are patterned and formed.

Next, a thick oxide 92 is deposited over the surface of the bit line region and subsequently, polysilicon contact via 69 is created. Referring now back to FIG. 6, a second metal layer 30 (using either W or Al) is deposited on the upper surface of the substrate. Subsequently, the second bit line pairs 34 and 34' are patterned and formed.

Figure 11:
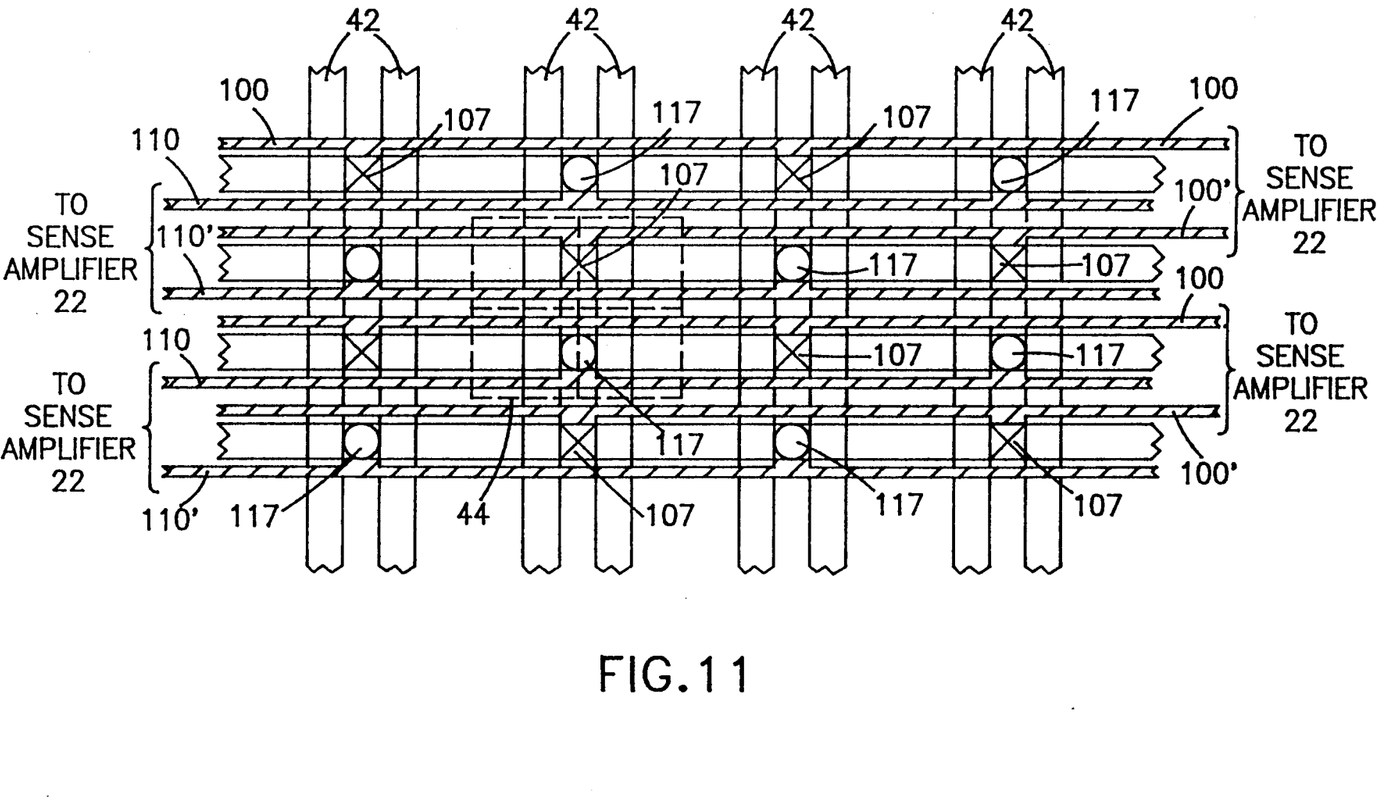
FIG. 11 is a schematic illustration of a layout for a sidewall bit line contact and spacer bit line rail.
Figure 12:
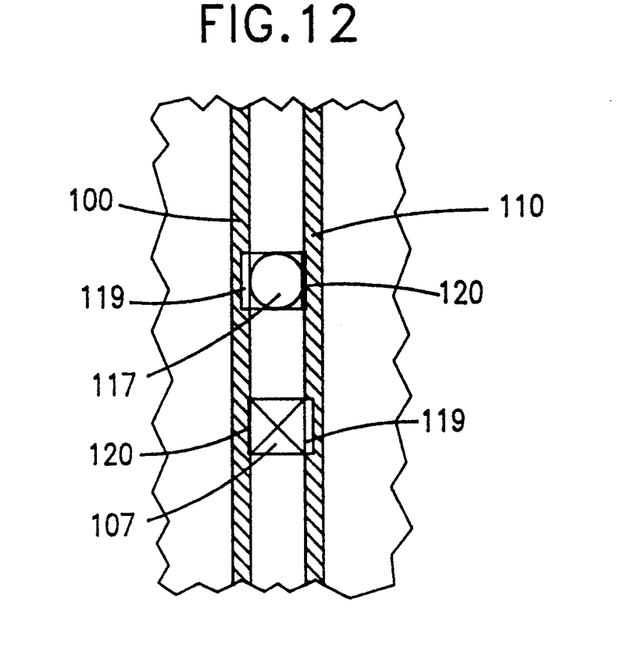
FIG. 12 is a schematic illustration showing the structure of the sidewall bit line contact.
Figure 13:
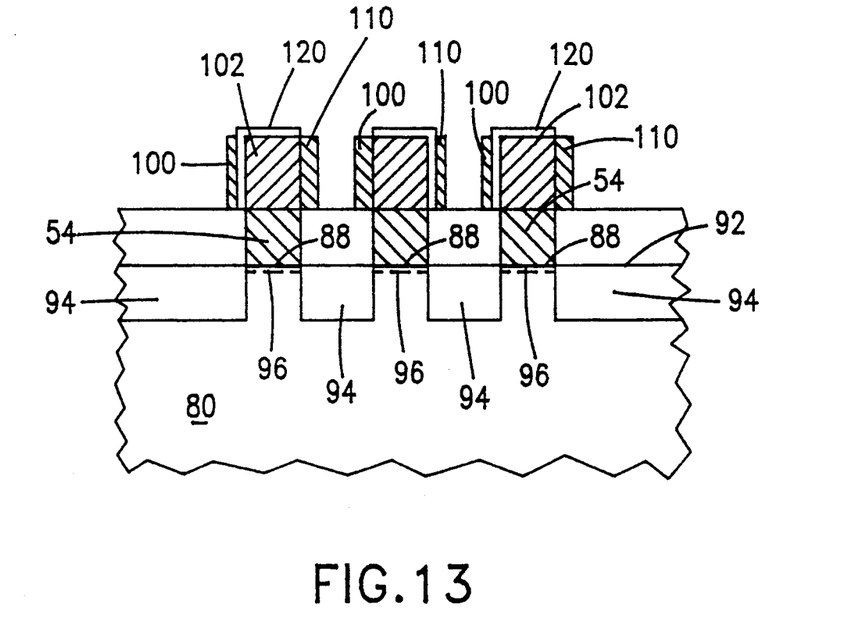
FIGS. 13 through 18 are schematic illustrations showing the structure of the sidewall bit line contact structure of FIG. 12 during steps in the fabrication process thereof.

The second example is a more aggressive approach proposing the use of the side-wall bit line contact and spacer bit line rail as a connecting line to implement the IFBL array. The layout example is shown in FIG. 11. The basic cells have been arranged into an array with the side-wall bit line contacts alternating in the odd-/even rows, as shown in FIG. 11. The first set of the true and complement bit lines 100 and 100' are connected to the left-hand side-wall contacts 107 to the left-hand side-wall interconnection spacer rails in parallel direction to both sides of the memory array. The second set of the true and complement bit lines 110 and 110' are connected to the right-hand side-wall contacts 117 to the right-hand side-wall interconnection spacer rails. The word lines 42 run in column direction. A memory cell 44 is placed at each intersection of a word line and bit line. FIGS. 12 and 13 are the top view and the cross section view of the side-wall bit line contact structure, respectively; and its process flow is shown in FIGS. 14 through 18. As in the structure of the offset bit line embodiment shown in FIG. 3, the true and complement lines of the side wall bit line embodiment of FIG. 11 are connected to similar sense amplifiers 22.

Referring to FIGS. 12 and 13, the two memory cells are designed to be shared with the same drain junction and the same bit line contact stud. The left-hand and right-hand side-wall contacts 107 and 117 are formed on the same polysilicon pillar 102 formed on the bit line contact stud 54 with different blocking 119 and ohmic 120 contacts. The left-hand and right-hand side-wall spacer rails 100 and 110 are formed with the same conducting material.

Turning now to FIGS. 14-18, the method of fabrication employed to achieve the side-wall bit line contact structure to implement the IFBL array, as shown in FIGS. 12 and 13, will be described.

Figure 14:
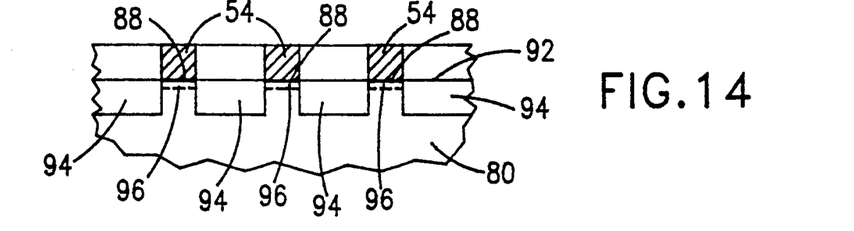

In FIG. 14, a side cross section of the structure is shown with transfer transistors and storage capacitors placed therein using known DRAM technology. Subsequently, the polysilicon bit line studs 54 are formed to provide contact, via silicide 88 at the silicon surface 92, to the drain junction 94 that resides in substrate 80. Bordering either side of drain junction 96 are shallow trench isolation (STI) areas 94.

Figure 15:
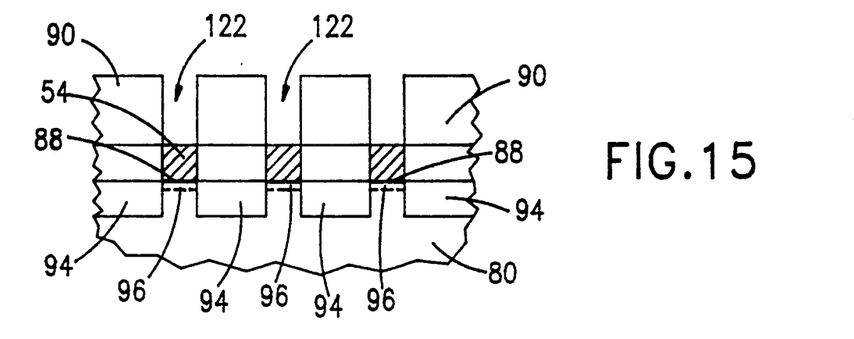
Figure 16:
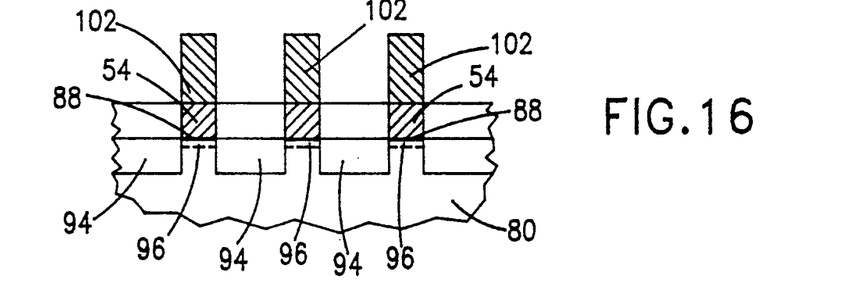

Subsequently, as shown in FIG. 15, an insulating material 90 is deposited and planarized. Then the polysilicon pillar contact studs holes are opened. Next, the polysilicon layer is deposited. The polysilicon pillar 102 formed as shown in FIG. 16.

Figure 17:
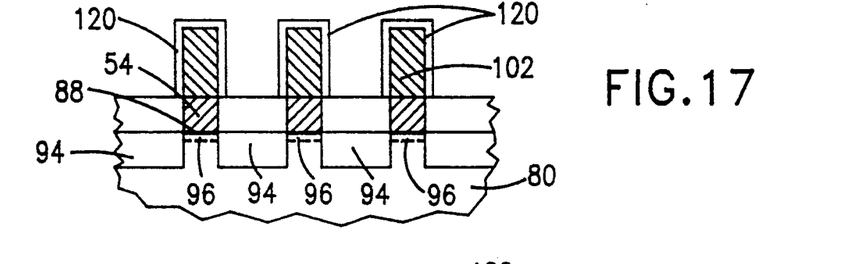
Figure 18:
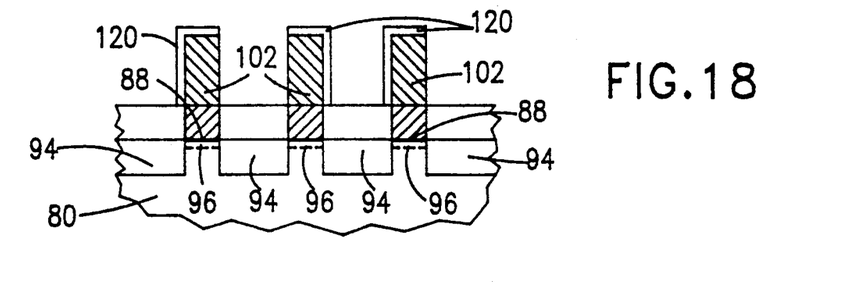

Next, layer 120 of insulating material such as silicon nitride is deposited above the polysilicon pillar 102, as shown in FIG. 17. Subsequently, the layer of insulating material on one side of the polysilicon pillar 102 is removed. Referring now back to FIG. 13, a vertical conformal conductor layer (using either W or polysilicon) is deposited on the side wall of the extension bit line contact studs. Subsequently, the spacer rail bit line pairs 100 and 110 are patterned and formed.

Figure 19:
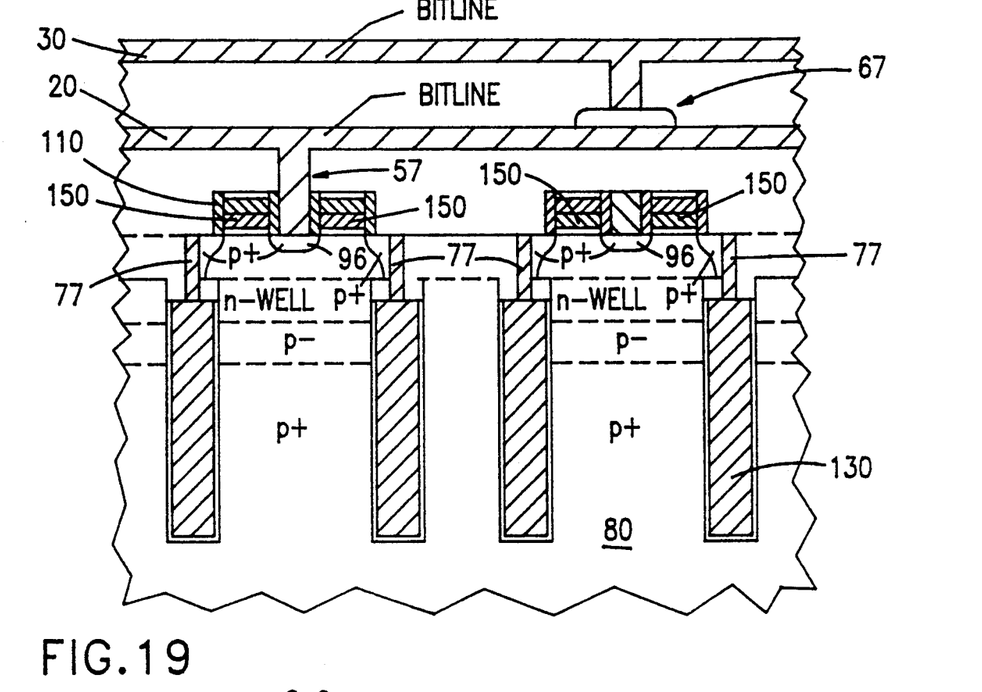
FIG. 19 is a schematic illustration of a cross section of a Mesa Transistor Trench Capacitor cell (MTT cell) that incorporates the off-set bit line contact architecture of the present invention.
Figure 20:
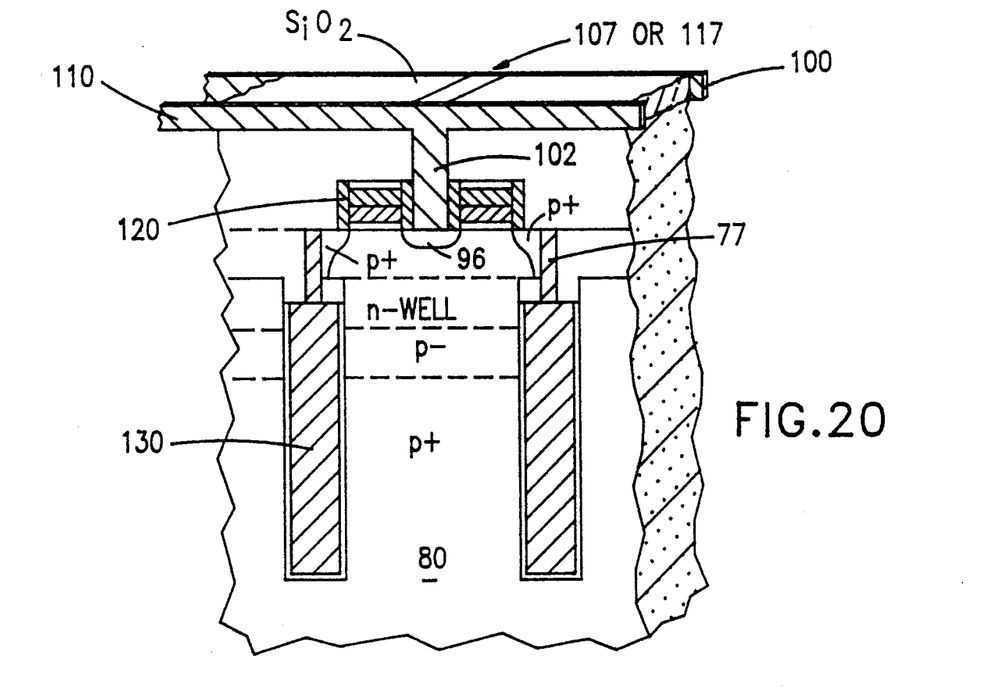
FIG. 20 is a schematic illustration of a MTT cell that incorporates the sidewall bit line contact structure of the present invention.

The new bit line contacts, off-set and side-wall, can be used in many memory cell structure applications. One of the applications, the open bit line MTT cell (Mesa Transistor Trench capacitor memory cell) is shown in FIGS. 19 and 20 as an example to demonstrate the concept. The schematic cross section of the MTT cell is shown in FIG. 19. The source 94 of the transfer transistor is connected with poly-Si strap 77 to the trench capacitor 130. Also, the two transfer transistors are designed to be shared with the same drain junction 96 and the same bit line contact 57 or off-set bit line contact 67. The word lines are connected to the polycide transfer gates 150. The new bit line contacts are implemented by using either off-set bit line as shown in FIG. 19 or side-wall bit line contact approaches as shown in FIG. 20. In the first case, the bit line can be constructed by using a layer of interconnecting line 20 (aluminum or tungsten) to connect the interdigitated cells associated to it. The second layer bit line 30 (aluminum or tungsten) is added to connect the other part of the interdigitated cells associated to the off-set bit line contacts. Similarly, in the second case, in order to achieve the other approaches of IFBL array designs, the bit lines are formed by depositing vertical conformal conductor side-wall spacer rails 100 and 110. By connecting the bit line contacts 107 or 117 with two different side-wall spacer rails 100 and 110 in an alternating row order, the true and complement bit lines will run parallel to both sides of the memory array. The IFBL array design can be applied to the other trench or stacked cells as well.

What has been described is a new and unique folded bit line configuration and fabrication process therefor for semiconductor memory devices. The new folded bit line configuration, referred to as an interdigitated fold bit line, has been shown and described in an offset bit line contact embodiment and a side wall bit line contact embodiment.

Having thus described our invention what we claim as new and desire to secure as Letters Patent, is:

1. A method of fabricating a folded bit line structure for a semiconductor memory device comprising the steps of:

Step 1: providing a substrate containing a plurality of spaced drain junction regions therein, Step 2: forming a conductive bit line stud over each of said plurality of drain regions, Step 3: forming a vertical pillar over each of said plurality of conductive bit line studs, Step 4: depositing a layer of insulating material on the top and sides of each of said plurality of pillars, Step 5: removing said insulating material from a first side of alternating ones of said plurality of pillars, Step 6: removing said insulating material from a second side opposite to said first side of the other of said plurality of pillars disposed between said pillars having said insulating material removed from said first side, Step 7: forming conductive pairs of conductive spacer rail bit line pairs, one bit line spacer rail of each pair being disposed on said first and second opposite side of each of said plurality of pillars.

* * * * *